US006930932B2

United States Patent
Rentschler

(10) Patent No.: US 6,930,932 B2
(45) Date of Patent: Aug. 16, 2005

(54) DATA SIGNAL RECEPTION LATCH CONTROL USING CLOCK ALIGNED RELATIVE TO STROBE SIGNAL

(75) Inventor: Eric McCutcheon Rentschler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/650,071

(22) Filed: Aug. 27, 2003

(65) Prior Publication Data

US 2005/0047222 A1 Mar. 3, 2005

(51) Int. Cl.[7] .................................................. G11C 7/00
(52) U.S. Cl. ........................ 365/193; 365/191; 365/233
(58) Field of Search ............................ 365/191, 193 O, 365/194, 233; 375/355

(56) References Cited

U.S. PATENT DOCUMENTS

| 6,028,816 | A | | 2/2000 | Takemae et al. | |
|---|---|---|---|---|---|
| 6,333,875 | B1 | | 12/2001 | Shinozaki | |
| 6,466,491 | B2 | | 10/2002 | Yanagawa | |
| 6,484,268 | B2 | | 11/2002 | Tamura et al. | |
| 6,496,043 | B1 | * | 12/2002 | Moss et al. | 327/12 |
| 6,510,099 | B1 | * | 1/2003 | Wilcox et al. | 365/230.06 |
| 6,570,944 | B2 | * | 5/2003 | Best et al. | 375/355 |
| 6,603,706 | B1 | * | 8/2003 | Nystuen et al. | 365/233 |
| 6,681,301 | B1 | * | 1/2004 | Mehta et al. | 711/154 |
| 6,707,723 | B2 | * | 3/2004 | Jeong | 365/189.05 |
| 2002/0147892 | A1 | | 10/2002 | Rentschler et al. | |
| 2002/0147896 | A1 | | 10/2002 | Rentschler et al. | |
| 2002/0147898 | A1 | | 10/2002 | Rentschler et al. | |
| 2002/0172079 | A1 | | 11/2002 | Hargis et al. | |
| 2003/0002316 | A1 | | 1/2003 | Morita et al. | |
| 2003/0004667 | A1 | | 1/2003 | Zurnkehr | |
| 2004/0044919 | A1 | * | 3/2004 | Dabral | 713/400 |

* cited by examiner

Primary Examiner—VanThu Nguyen

(57) ABSTRACT

A strobe signal is requested from a transmitting device, if no strobe signal has been received within a pre-determined elapsed time. A clock signal aligned relative to an edge of a the strobe signal is generated. One or more data signals received from the transmitting device are latched using the clock signal.

26 Claims, 10 Drawing Sheets

DATA SIGNAL RECEPTION LATCH CONTROL USING CLOCK ALIGNED RELATIVE TO STROBE SIGNAL

TECHNICAL FIELD

The present invention relates to the field of data signal reception.

BACKGROUND ART

One double data rate (DDR) synchronous dynamic random access memory (SDRAM) system uses strobe signals to help transmit data between a memory controller and one or more DDR SDRAM memory modules mounted on a printed circuit board. For memory read operations, a DDR SDRAM memory module transmits a strobe signal along with associated data signals to the memory controller which then uses the strobe signal to latch the data signals. For memory write operations, the memory controller similarly transmits a strobe signal along with associated data signals to a DDR SDRAM memory module which then uses the strobe signal to latch the data signals.

Because the strobe signal should be delayed by ¼ phase relative to its associated data signals to help ensure the data signals are timely latched and because the DDR SDRAM memory module(s) do not delay the strobe signal for either memory read or write operations, the trace in the printed circuit board for the strobe signal route is extended to provide this delay for both memory read and write operations.

The length of trace to provide this delay, however, is a function of the clock frequency at which the strobe signal and its associated data signals are driven. Because the DDR SDRAM system on a given printed circuit board may be driven in only a specific frequency range, supporting other frequencies involves a printed circuit board design change. Extending the strobe signal route may also pose problems for printed circuit board designers as the length of trace to provide this delay may be excessively long.

Instead of extending the strobe signal route trace, the memory controller may comprise a delay circuit to delay the strobe signal in writing data to a DDR SDRAM memory module and in reading data from a DDR SDRAM memory module. The delay provided by the memory controller for memory reads, however, may vary from ¼ of the phase of the strobe signal from the DDR SDRAM memory module due to, for example, variations in process, variations in supply voltage, and/or variations in temperature of the memory controller and/or the DDR SDRAM memory module. This strobe delay variation due to such process, voltage, and/or temperature (PVT) variations may in turn limit the clock frequency at which the data signals may be driven and timely latched by the memory controller with adequate reliability.

SUMMARY

A strobe signal is requested from a transmitting device, if no strobe signal has been received within a pre-determined elapsed time. A clock signal aligned relative to an edge of the strobe signal is generated. One or more data signals received from the transmitting device are latched using the clock signal.

BRIEF DESCRIPTION OF DRAWINGS

One or more embodiments of the present invention are illustrated by way of example and not limitation in the figures of the accompanying drawings, in which like references indicate similar elements and in which.

DETAILED DESCRIPTION

The following detailed description sets forth an embodiment or embodiments for data signal reception latch control using a clock aligned relative to a strobe signal.

Figure 1:
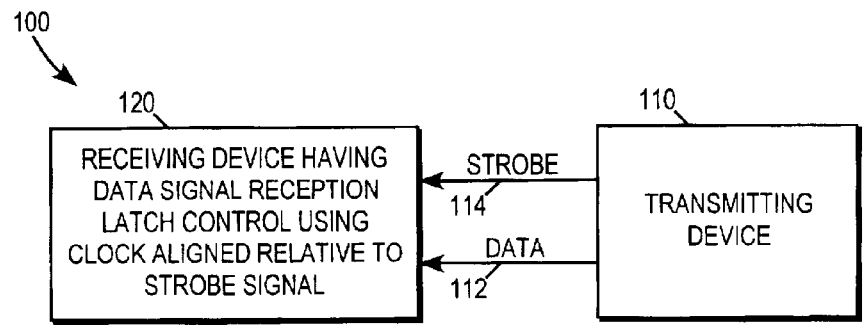
FIG. 1 illustrates, for one embodiment, a system comprising a receiving device having data signal reception latch control using a clock aligned relative to a strobe signal.

FIG. 1 illustrates, for one embodiment, a system 100 comprising a transmitting device 110 and a receiving device 120 having data signal reception latch control using a clock aligned relative to a strobe signal 114. Transmitting device 110 is coupled to receiving device 120 to transmit one or more data signals 112 to receiving device 120. Transmitting device 110 transmits to receiving device 120 one or more strobe signals 114 in association with one or more sets of one or more data signals 112 to help receiving device 120 identify one or more associated data signals 112. Receiving device 120 receives one or more sets of one or more data signals 112 and one or more associated strobe signals 114.

Figure 2:
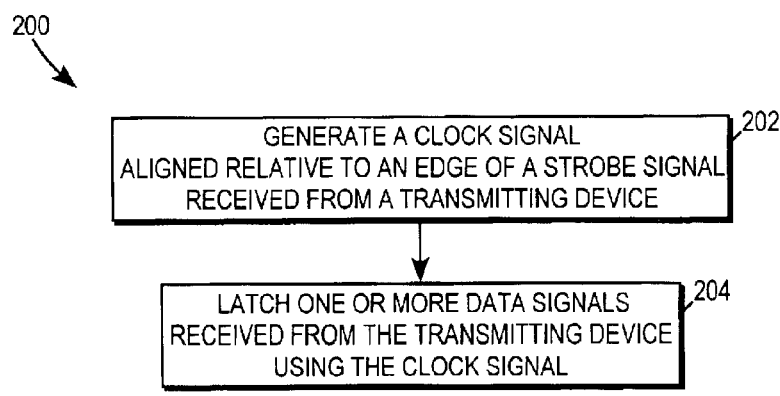
FIG. 2 illustrates, for one embodiment, a flow diagram to latch one or more data signals using a clock aligned relative to a strobe signal.

Receiving device 120 for one embodiment may latch one or more data signals 112 from transmitting device 110 in accordance with a flow diagram 200 of FIG. 2. Receiving device 120 for block 202 of FIG. 2 generates a clock signal aligned relative to an edge of a strobe signal 114 received from transmitting device 110 and for block 204 latches one or more data signals 112 received from transmitting device 110 using the generated clock signal.

Transmitting device 110 and receiving device 120 may each comprise any suitable circuitry to transmit and receive, respectively, one or more data signals 112 in this manner. Transmitting device 110 for one embodiment may be formed as an integrated circuit, and receiving device 120 for one embodiment may be formed as an integrated circuit.

By generating a clock signal aligned relative to a received strobe signal 114 to latch one or more received data signals 112, receiving device 120 for one embodiment may receive and latch one or more data signals 112 from transmitting device 110 with reduced or minimized concern for timing variations due to, for example, variations in process, variations in supply voltage, and/or variations in temperature of transmitting device 110 and/or receiving device 120. Receiving device 120 for one embodiment may also receive and latch one or more data signals 112 driven by transmitting device 110 at any suitable clock frequency with reduced or minimized concern for the length of a printed circuit board trace to route a strobe signal 114 from transmitting device 110 to receiving device 120.

Figure 3:
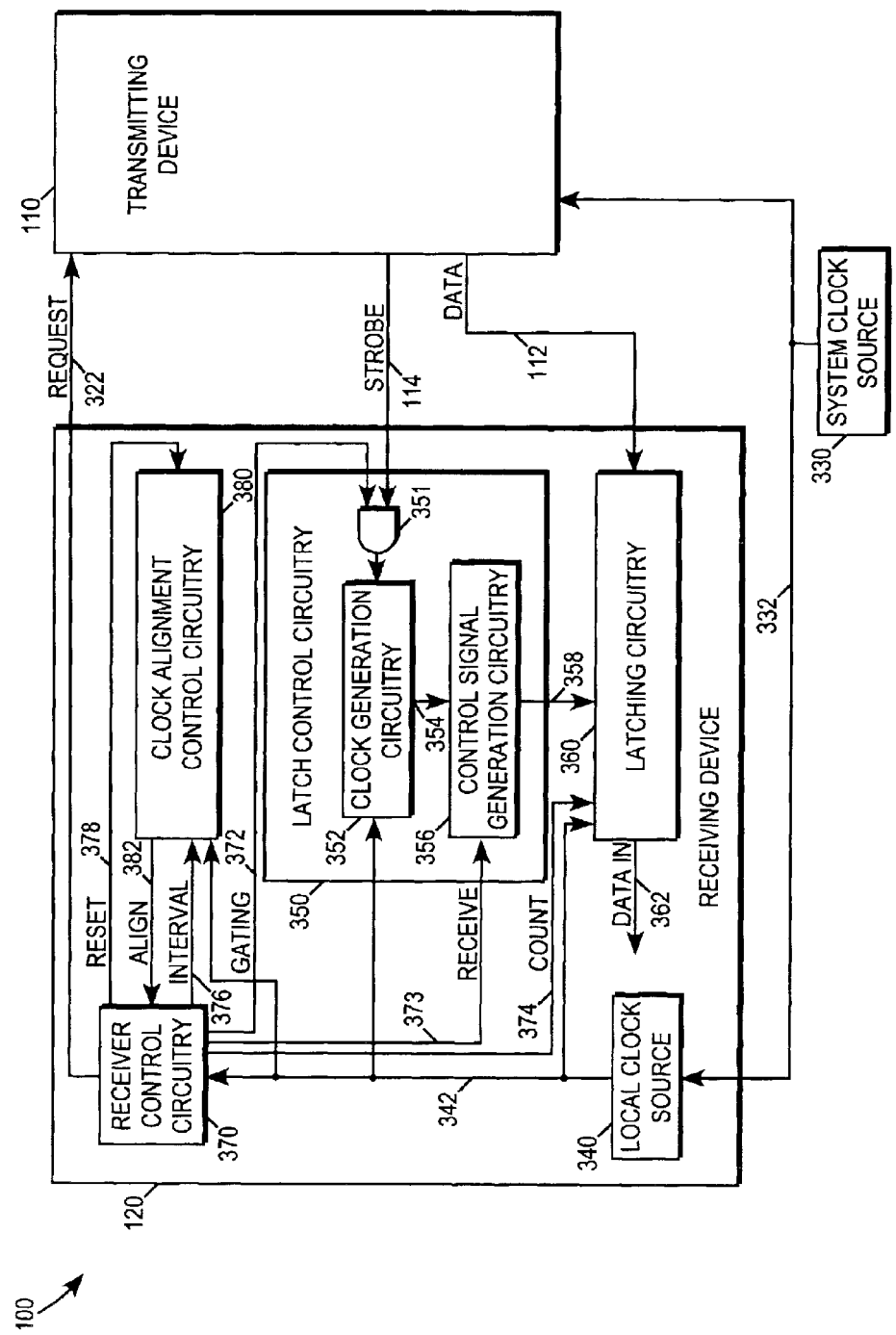
FIG. 3 illustrates, for one embodiment, circuitry for the receiving device of FIG. 1.

System 100 for one embodiment, as illustrated in FIG. 3, may comprise a system clock source 330 to generate and output a system clock signal 332 having any suitable pulse width and any suitable frequency to help clock circuitry of both transmitting device 110 and receiving device 120, helping to synchronize communications between transmitting device 110 and receiving device 120.

Receiving device 120 for one embodiment, as illustrated in FIG. 3, may comprise a local clock source 340, latch control circuitry 350, latching circuitry 360, and receiver control circuitry 370 to receive and latch one or more data signals 112 from transmitting device 110.

Local clock source 340 for one embodiment may be coupled to receive system clock signal 332 to generate and output a local clock signal 342 to help clock circuitry of receiving device 120. Local clock source 340 may comprise any suitable circuitry to generate local clock signal 342 with any suitable pulse width, any suitable frequency, and any suitable relationship relative to system clock signal 332 in any suitable manner. Local clock source 340 for one embodiment may output system clock signal 332 as local clock signal 342. Local clock source 340 for one embodiment may generate and output a local clock signal 342 having approximately twice the pulse width and approximately half the frequency as system clock signal 332.

Figure 4:
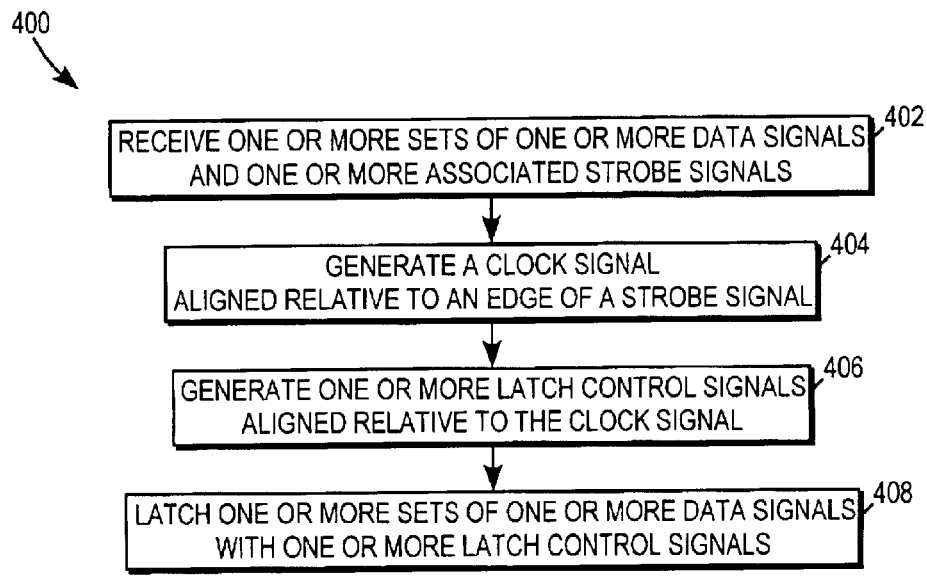
FIG. 4 illustrates, for one embodiment, a flow diagram to receive one or more data signals with latch control using a clock aligned relative to a strobe signal.

Receiving device 120 for one embodiment may receive and latch one or more data signals 112 from transmitting device 110 in accordance with a flow diagram 400 of FIG. 4.

For block 402 of FIG. 4, receiving device 120 receives one or more sets of one or more data signals 112 and one or more associated strobe signals 114. Receiving device 120 may receive one or more sets of any suitable number of one or more data signals 112 and one or more associated strobe signals 114 in any suitable manner over any suitable number of one or more signal lines.

Receiving device 120 for one embodiment may transmit a request signal 322 to transmitting device 110 to request one or more data signals from transmitting device 110. Request signal 322 may comprise any suitable information embodied in any suitable format and may be transmitted over any suitable number of signal lines. For one embodiment, as illustrated in FIG. 3, receiver control circuitry 370 may generate and transmit request signal 322 to transmitting device 110.

For another embodiment, transmitting device 110 may initiate transmission of one or more data signals 112 to receiving device 120.

Receiving device 120 for one embodiment may receive at one time one strobe signal 114 and one associated set of any suitable number of one or more data signals 112. Receiving device 120 for another embodiment may receive one strobe signal 114 and one associated set of a plurality of data signals 112 one or more data signals 112 at a time.

Receiving device 120 for one embodiment may receive one strobe signal 114 and more than one associated set of any suitable number of one or more data signals 112. Receiving device 120 for one embodiment may receive a strobe signal 114 and one or more data signals 112 from a transmitting device 110 that generates and transmits a strobe signal 114 defining a pulse having a first edge, such as a rising edge for example, associated with a first set of one or more data signals 112 and a second edge, such as a falling edge for example, associated with a second set of one or more data signals 112.

Receiving device 120 for one embodiment may receive a strobe signal 114 and one or more data signals 112 from a transmitting device 110 that generates and transmits a strobe signal 114 in substantial alignment with one or more data signals 112. Receiving device 120 for another embodiment may receive a strobe signal 114 and one or more data signals 112 from a transmitting device 110 that generates and transmits a strobe signal 114 delayed by a predetermined amount of time relative to one or more data signals 112.

For one embodiment, as illustrated in FIG. 3, latching circuitry 360 is coupled to receive one or more data signals 112, and latch control circuitry 350 is coupled to receive one or more strobe signals 114.

For block 404 of FIG. 4, receiving device 120 generates a clock signal aligned relative to an edge of a strobe signal 114. Receiving device 120 may generate any suitable clock signal having any suitable pulse width, any suitable frequency, and any suitable relationship relative to an edge of a strobe signal 114 in any suitable manner.

For one embodiment, as illustrated in FIG. 3, latch control circuitry 350 comprises clock generation circuitry 352 coupled to receive one or more strobe signals 114 to generate a clock signal 354 aligned relative to an edge of a strobe signal 114. Clock generation circuitry 352 may comprise any suitable circuitry to generate a clock signal 354 aligned relative to an edge of a strobe signal 114. Clock generation circuitry 352 for one embodiment may help maintain the alignment of clock signal 354 relative to an edge of a strobe signal 114 by aligning clock signal 354 as clock generation circuitry 352 continues receiving strobe signals 114.

Clock generation circuitry 352 for one embodiment may generate clock signal 354 aligned relative to an edge of a strobe signal 114 to help generate a clock signal 354 in substantial synchronization or another predetermined relationship with strobe signals 114 generated by transmitting device 110. Receiving device 120 may then use clock signal 354 to latch one or more data signals 112 from transmitting device 110 with increased reliability relative to latching one or more data signals 112 using local clock signal 342 as local clock signal 342 may be more susceptible to deviate from the clock signal used to generate a strobe signal 114 by transmitting device 110 due to, for example, variations in process, variations in supply voltage, and/or variations in temperature of transmitting device 110 and/or receiving device 120.

Clock generation circuitry 352 for one embodiment may be coupled to receive local clock signal 342 to help generate clock signal 354. Clock generation circuitry 352 for one embodiment may generate a clock signal 354 by aligning local clock signal 342 relative to an edge of a strobe signal 114. Clock generation circuitry 352 for another embodiment may generate clock signal 354 by generating another clock signal from local clock signal 342, for example by multiplying or dividing local clock signal 342, and aligning the resulting clock signal relative to an edge of a strobe signal 114.

Clock generation circuitry 352 for one embodiment may generate clock signal 354 with an edge of clock signal 354 substantially aligned with an edge of a strobe signal 114. For one embodiment, the ratio of the frequency of clock signal 354 to that of strobe signals 114 may be approximately m:n, where m and n are integers. Where m is equal to n, that is where the frequency of clock signal 354 is substantially the same as the frequency at which a strobe signal 114 may be generated by transmitting device 110, clock generation circuitry 352 for one embodiment may help generate clock signal 354 to be substantially phase-aligned with a strobe signal 114.

Clock generation circuitry 352 for one embodiment may generate clock signal 354 with an edge of clock signal 354 delayed from an edge of a strobe signal 114 by a predetermined amount of time. Clock generation circuitry 352 for one embodiment may generate clock signal 354 to be phase-delayed relative to a strobe signal 114. Clock generation circuitry 352 for one embodiment may delay clock signal 354 by a suitable predetermined amount of time relative to a strobe signal 114 to help time when one or more data signals 112 are to be latched.

Where transmitting device 110 may allow a strobe signal line to float in a high impedance state, for example, when transmitting device 110 is not driving the strobe signal line, clock generation circuitry 352 for one embodiment, as illustrated in FIG. 3, may be coupled to receive one or more gated strobe signals through an AND gate 351, for example, coupled to receive one or more strobe signals 114 on the strobe signal line and coupled to receive one or more gating signals 372 from receiver control circuitry 370. Receiver control circuitry 370 for one embodiment may then help prevent clock generation circuitry 352 from receiving noise that may be on the strobe signal line when transmitting device 110 is not driving the strobe signal line and that could otherwise interfere with the alignment of clock signal 354. Latch control circuitry 350 for another embodiment may comprise any other suitable circuitry responsive to one or more gating signals 372 to help receiver control circuitry 370 selectively control the reception of signals on a strobe signal line by clock generation circuitry 352.

Figure 5:
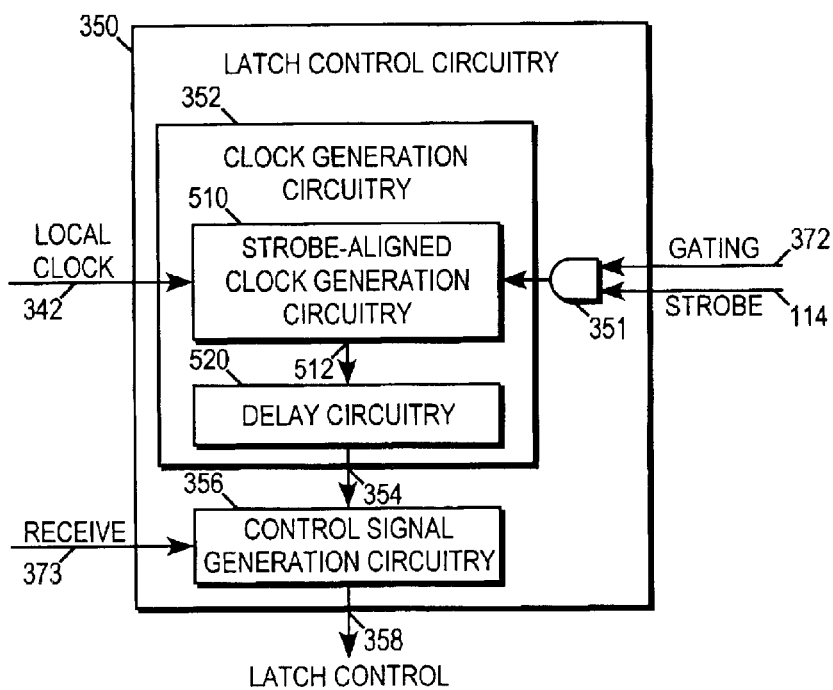
FIG. 5 illustrates, for one embodiment, latch control circuitry for the receiving device of FIG. 3.

Clock generation circuitry 352 for one embodiment, as illustrated in FIG. 5, may comprise strobe-aligned clock generation circuitry 510 and delay circuitry 520.

Strobe-aligned clock generation circuitry 510 is coupled to receive one or more strobe signals 114 and for one embodiment may generate a strobe-aligned clock signal 512 with an edge of strobe-aligned clock signal 512 substantially aligned with an edge of a strobe signal 114. Strobe-aligned clock generation circuitry 510 may generate strobe-aligned clock signal 512 with any suitable pulse width, any suitable frequency, and any suitable phase relationship relative to an edge of a strobe signal 114 in any suitable manner. Where the frequency of strobe-aligned clock signal 512 is substantially the same as the frequency at which a strobe signal 114 may be generated by transmitting device 110, strobe-aligned clock generation circuitry 510 for one embodiment may generate strobe-aligned clock signal 512 to be substantially phase-aligned with a strobe signal 114.

Strobe-aligned clock generation circuitry 510 may comprise any suitable circuitry. Strobe-aligned clock generation circuitry 510 for one embodiment may comprise a tracking interpolator to generate strobe-aligned clock signal 512. Strobe-aligned clock generation circuitry 510 for one embodiment may be coupled to receive local clock signal 342 to help generate strobe-aligned clock signal 512.

Delay circuitry 520 is coupled to receive strobe-aligned clock signal 512 to delay strobe-aligned clock signal 512 by a predetermined amount of time to generate clock signal 354. Delay circuitry 520 for one embodiment may generate clock signal 354 to be phase-delayed relative to strobe-aligned clock signal 512. Where the frequency of strobe-aligned clock signal 512 is substantially the same as the frequency at which a strobe signal 114 may be generated by transmitting device 110, delay circuitry 520 for one embodiment may then generate clock signal 354 to be phase-delayed relative to a strobe signal 114.

Delay circuitry 520 may comprise any suitable circuitry. Delay circuitry 520 for one embodiment may comprise a delayed lock loop (DLL) to delay strobe-aligned clock signal 512 by a predetermined amount of time to generate clock signal 354.

For block 406 of FIG. 4, receiving device 120 generates one or more latch control signals aligned relative to the clock signal generated for block 404. Receiving device 120 may generate any suitable number of one or more latch control signals in any suitable manner over any suitable number of signal lines to latch any suitable number of one or more data signals 112.

Receiving device 120 for one embodiment may generate one latch control signal 358 at a time to latch one or more data signals 112. Receiving device 120 for one embodiment may generate one latch control signal 358 at a time to latch one set of one or more data signals 112. Receiving device 120 for one embodiment may generate a plurality of latch control signals 358 to latch one set of a plurality of data signals 112 one or more data signals 112 at a time. Receiving device 120 for one embodiment may generate a plurality of latch control signals 358 to latch a plurality of sets of one or more data signals 112.

For one embodiment, as illustrated in FIG. 3, latch control circuitry 350 comprises control signal generation circuitry 356 coupled to receive clock signal 354 to generate one or more latch control signals 358 aligned relative to clock signal 354. Control signal generation circuitry 356 may comprise any suitable circuitry to generate one or more latch control signals 358 aligned relative to clock signal 354.

Control signal generation circuitry 356 for one embodiment may be coupled to receive one or more receive signals 373 from receiver control circuitry 370 to help time when control signal generation circuitry 356 is to generate one or more latch control signals 358. Receiver control circuitry 370 for one embodiment may generate one or more receive signals 373 in response to transmitting a request signal 322 to transmitting device 110. Receiver control circuitry 370 for one embodiment may generate a receive signal 373 at a suitable delay following transmission of a request signal 322. Control signal generation circuitry 356 for one embodiment may be coupled to receive, in addition to or in lieu of receive signal(s) 373, one or more strobe signals 114 and/or one or more gating signals 372 to help time when control signal generation circuitry 356 is to generate one or more latch control signals 358.

Figure 6:
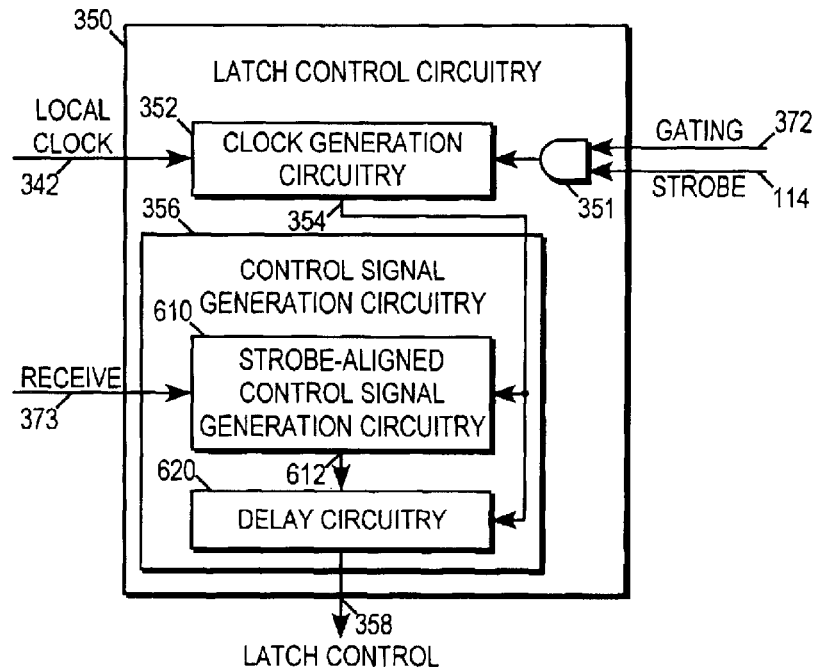
FIG. 6 illustrates, for another embodiment, latch control circuitry for the receiving device of FIG. 3.

Control signal generation circuitry 356 for one embodiment may generate one or more latch control signals 358 in response to an edge of clock signal 354. Control signal generation circuitry 356 for one embodiment may generate one or more latch control signals 358 with an edge of one or more latch control signals 358 substantially aligned with an edge of clock signal 354. Control signal generation circuitry 356 for one embodiment may generate one or more latch control signals 358 with an edge of one or more latch control signals 358 delayed from an edge of clock signal 354 by a predetermined amount of time. Control signal generation circuitry 356 for one embodiment may delay one or more latch control signals 358 relative to clock signal 354 by a suitable predetermined amount of time to help time when one or more data signals 112 are to be latched.

Where clock generation circuitry 352 generates clock signal 354 with an edge substantially aligned with an edge of a strobe signal 114, control signal generation circuitry 356 for one embodiment, as illustrated in FIG. 6, may comprise strobe-aligned control signal generation circuitry 610 and delay circuitry 620.

Strobe-aligned control signal generation circuitry 610 is coupled to receive clock signal 354 and for one embodiment may generate one or more strobe-aligned latch control signals 612 with an edge of one or more strobe-aligned latch control signals 612 substantially aligned with an edge of clock signal 354. Strobe-aligned control signal generation circuitry 610 may generate any suitable number of one or more strobe-aligned latch control signals 612 in any suitable manner over any suitable number of signal lines. Strobe-aligned control signal generation circuitry 610 for one embodiment may be coupled to receive one or more receive signals 373, one or more gating signals 372, and/or one or more strobe signals 114 to help time when strobe-aligned control signal generation circuitry 610 is to generate one or more strobe-aligned latch control signals 612. Strobe-aligned control signal generation circuitry 610 may comprise any suitable circuitry.

Delay circuitry 620 is coupled to receive one or more strobe-aligned latch control signals 612 to delay one or more strobe-aligned latch control signals 612 by a predetermined amount of time to generate one or more latch control signals 358. Delay circuitry 620 for one embodiment may be coupled to receive clock signal 354 to help generate one or more latch control signals 358 to be phase-delayed relative to clock signal 354.

For block 408 of FIG. 4, receiving device 120 latches one or more sets of one or more data signals 112 with one or more latch control signals 358. Receiving device 120 may latch one or more sets of one or more data signals 112 with one or more latch control signals 358 in any suitable manner.

Receiving device 120 for one embodiment may latch at one time one or more data signals 112 using one latch control signal 358. Receiving device 120 for one embodiment may latch at one time one set of one or more data signals 112 using one latch control signal 358. Receiving device 120 for one embodiment may latch one set of a plurality of data signals 112 one or more data signals 112 at a time using a plurality of latch control signals 358. Receiving device 120 for one embodiment may latch a plurality of sets of one or more data signals 112 using a plurality of latch control signals 358.

For one embodiment, as illustrated in FIG. 3, latching circuitry 360 is coupled to receive one or more latch control signals 358 to latch one or more data signals 112. Latching circuitry 360 may comprise any suitable circuitry to latch one or more data signals 112 using one or more latch control signals 358.

Latching circuitry 360 for one embodiment may comprise a latch to latch one or more received data signals 112 using one latch control signal 358. Latching circuitry 360 for one embodiment may comprise a latch to latch a set of one or more data signals 112 using one latch control signal 358. Latching circuitry 360 for one embodiment may comprise a plurality of latches to latch a plurality of data signals 112 using a plurality of latch control signals 358. Latching circuitry 360 for one embodiment may comprise a plurality of latches to latch a plurality of sets of one or more data signals 112 using a plurality of latch control signals 358.

Latching circuitry 360 for one embodiment may be coupled to receive local clock signal 342 to help clock the output of one or more data signals 112 from latching circuitry 360 as one or more data in signals 362 aligned relative to local clock signal 342. Latching circuitry 360 for one embodiment may comprise any suitable circuitry, such as a buffer for example, that is coupled to receive local clock signal 342 to help output one or more data signals 112 from latching circuitry 360 as one or more data in signals 362 aligned relative to local clock signal 342.

Where latching circuitry 360 comprises a plurality of latches, latching circuitry 360 for one embodiment may be coupled to receive one or more count signals 374 from receiver control circuitry 370 to help time when one or more data signals 112 from any one of the plurality of latches are to be output. Receiver control circuitry 370 for one embodiment may generate one or more count signals 374 in response to transmitting a request signal 322 to transmitting device 110. Receiver control circuitry 370 for one embodiment may generate a count signal 374 at a suitable delay following transmission of a request signal 322.

Latching circuitry 360 for one embodiment may be coupled to receive, in addition to or in lieu of count signal(s) 374, one or more gating signals 372 and/or one or more receive signals 373 to help time when one or more data signals 112 from any one of the plurality of latches are to be output.

Figure 7:
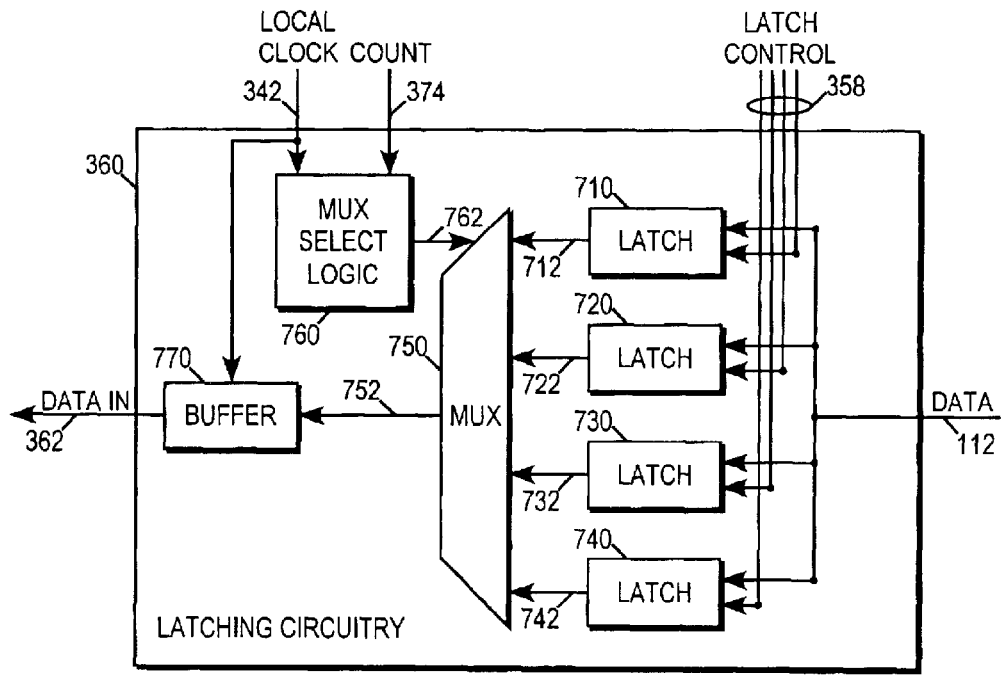
FIG. 7 illustrates, for one embodiment, latching circuitry for the receiving device of FIG. 3.

Latching circuitry 360 for one embodiment, as illustrated in FIG. 7, may comprise a plurality of latches 710, 720, 730, and 740, a multiplexer (MUX) 750, MUX select logic 760, and a buffer 770. Although described in the context of four latches 710, 720, 730, and 740, latching circuitry 360 for another embodiment may comprise two, three, or more than four latches.

Latches 710, 720, 730, and 740 are coupled to receive one or more data signals 112 and one or more latch control signals 358 to latch one or more received data signals 112. Latches 710, 720, 730, and 740 for one embodiment may each be coupled to receive a set of one or more data signals 112. Latches 710, 720, 730, and 740 for one embodiment, as illustrated in FIG. 7, may be coupled to one or more common signal lines to receive one or more data signals 112. Latches 710, 720, 730, and 740 for one embodiment, as illustrated in FIG. 7, may each be coupled to receive a latch control signal 358 over a respective signal line to latch one or more data signals 112. Latches 710, 720, 730, and 740 may each output one or more data signals 112 as one or more latch output signals 712, 722, 732, and 742, respectively.

MUX 750 is coupled to receive latch output signal(s) 712, 722, 732, and 742 to output one or more data signals 112 from any one latch 710, 720, 730, and 740, respectively, in a selective manner as one or more MUX output signals 752. MUX 750 is coupled to receive one or more MUX select signals 762 generated by MUX select logic 760 to select latch output signal(s) 712, 722, 732, or 742 for output as MUX output signal(s) 752.

MUX select logic 760 for one embodiment may be coupled to receive one or more count signals 374 and may generate one or more MUX select signals 762 in response to one or more count signals 374 to help select latch output signal(s) 712, 722, 732, or 742 for output as MUX output signal(s) 752 and to help time when latch output signal(s) 712, 722, 732, and 742 are to be output as MUX output signal(s) 752. MUX select logic 760 for one embodiment may be coupled to receive, in addition to or in lieu of count signal(s) 374, one or more gating signals 372 and/or one or more receive signals 373 to help select latch output signal(s) 712, 722, 732, or 742 for output as MUX output signal(s) 752 and to help time when latch output signal(s) 712, 722, 732, and 742 are to be output as MUX output signal(s) 752. MUX select logic 760 for one embodiment may be coupled to receive local clock signal 342 to help clock the selection of latch output signal(s) 712, 722, 732, or 742.

By selecting latch output signal(s) 712, 722, 732, or 742 from any one latch 710, 720, 730, or 740, respectively, for output as MUX output signal(s) 752 while receiving one or more data signals 112 in another latch 710, 720, 730, or 740, receiving device 120 for one embodiment may help allow data signals 112 to be transmitted from transmitting device 110 at a relatively higher speed.

Buffer 770 is coupled to receive MUX output signal(s) 752 and stores and outputs MUX output signal(s) 752 as one or more data in signals 362. Buffer 770 for one embodiment may be coupled to receive local clock signal 342 to help clock the output of MUX output signal(s) 752 as data in signal(s) 362 aligned relative to local clock signal 342. Buffer 770 may comprise any suitable circuitry. Buffer 770 for one embodiment may comprise one or more D-type flip-flops to store one or more data signals, respectively.

Example Timing Diagram

Figure 8:
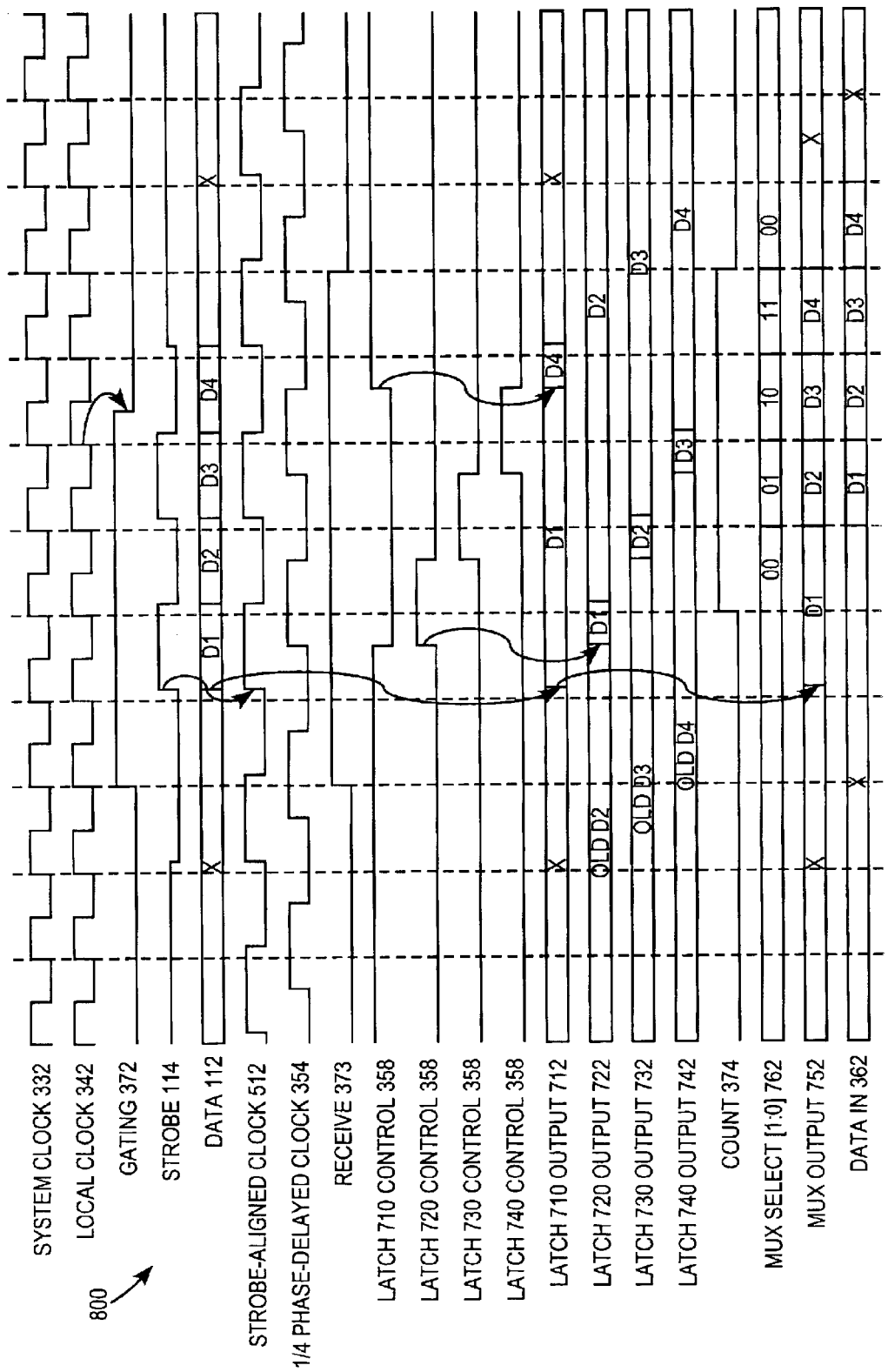
FIG. 8 illustrates, for one embodiment, a timing diagram for the receiving device of FIG. 3.

FIG. 8 illustrates, for one embodiment, an example timing diagram 800 where receiving device 120 comprises one embodiment of latch control circuitry 350 as illustrated in FIG. 5 and one embodiment of latching circuitry 360 as illustrated in FIG. 7, where local clock source 340 outputs system clock signal 332 as local clock signal 342, and where receiving device 120 receives one or more strobe signals 114 that define a pulse having a first edge associated with a first set of one or more data signals 112 and a second edge associated with a second set of one or more data signals 112 and that are in substantial alignment with one or more data signals 112.

As illustrated in FIGS. 3, 5, 7, and 8, clock generation circuitry 352 generates clock signal 354 by generating a strobe-aligned clock signal 512 in substantial synchronization with strobe signals 114 generated by transmitting device 110 and delaying strobe-aligned clock signal 512 by approximately ¼ phase. Control signal generation circuitry 356 is responsive to a receive signal 373 to generate for each latch 710, 720, 730, and 740 a respective latch control signal 358 substantially aligned with clock signal 354 to latch a respective set D1, D2, D3, and D4 of one or more data signals 112 in each latch 710, 720, 730, and 740, respectively.

For the example of FIG. 8 where control signal generation circuitry 356 generates each latch control signal 358 as a single binary signal, each latch 710, 720, 730, and 740 outputs or passes-through the set of data signal(s) 112 at the input of latch 710, 720, 730, and 740, respectively, in response to a latch control signal 358 in a first state, such as a high state for example. Each latch 710, 720, 730, and 740 latches the set of data signal(s) at the input of latch 710, 720, 730, and 740, respectively, in response to a transition of a latch control signal 358 from the first state to a second state, such as a low state for example. Each latch 710, 720, 730, and 740 outputs the set of data signal(s) 112 latched by the latch 710, 720, 730, and 740, respectively, in response to a latch control signal 358 in the second state.

As illustrated in FIG. 8, as the set D1 of data signal(s) 112 is received by latching circuitry 360, control signal generation circuitry 356 generates a latch control signal 358 to control latch 710 to output the set D1 of data signal(s) 112 as latch output signal(s) 712 and to latch the set D1 of data signal(s) 112 while continuing to output the set D1 of data signal(s) 112 as latch output signal(s) 712. As the set D2, D3, and D4 of data signal(s) 112 are received by latching circuitry 360, control signal generation circuitry 356 similarly generates a respective latch control signal 358 to control latch 720, 730, and 740, respectively, to output the respective set D2, D3, and D4 of data signal(s) 112 as latch output signal(s) 722, 732, and 742, respectively, and to latch the respective set D2, D3, and D4 of data signal(s) 112 while continuing to output the respective set D2, D3, and D4 of data signal(s) 112 as latch output signal(s) 722, 732, and 742, respectively.

MUX select logic 760 is responsive to a count signal 374 to generate MUX select signals 762 to control MUX 750 to output the set D1, D2, D3, and D4 of data signal(s) 112 from latch 710, 720, 730, and 740, respectively, in a selective manner as MUX output signal(s) 752. For the example of FIG. 8 where MUX select logic 760 generates a MUX select signal 762 as a double digit binary signal, MUX 750 outputs the set D1, D2, D3, and D4 of data signal(s) 112 from latch 710, 720, 730, and 740, respectively, in response to a MUX select signal 762 of, for example, 00, 01, 10, and 11, respectively. As each set D1, D2, D3, and D4 of data signal(s) 112 is output as MUX output signal(s) 752, buffer 770 is responsive to local clock signal 342 to store and output each set D1, D2, D3, and D4 of data signal(s) 112 as data in signal(s) 362.

Alternative Latching Circuitry and Example Timing Diagram

Figure 9:
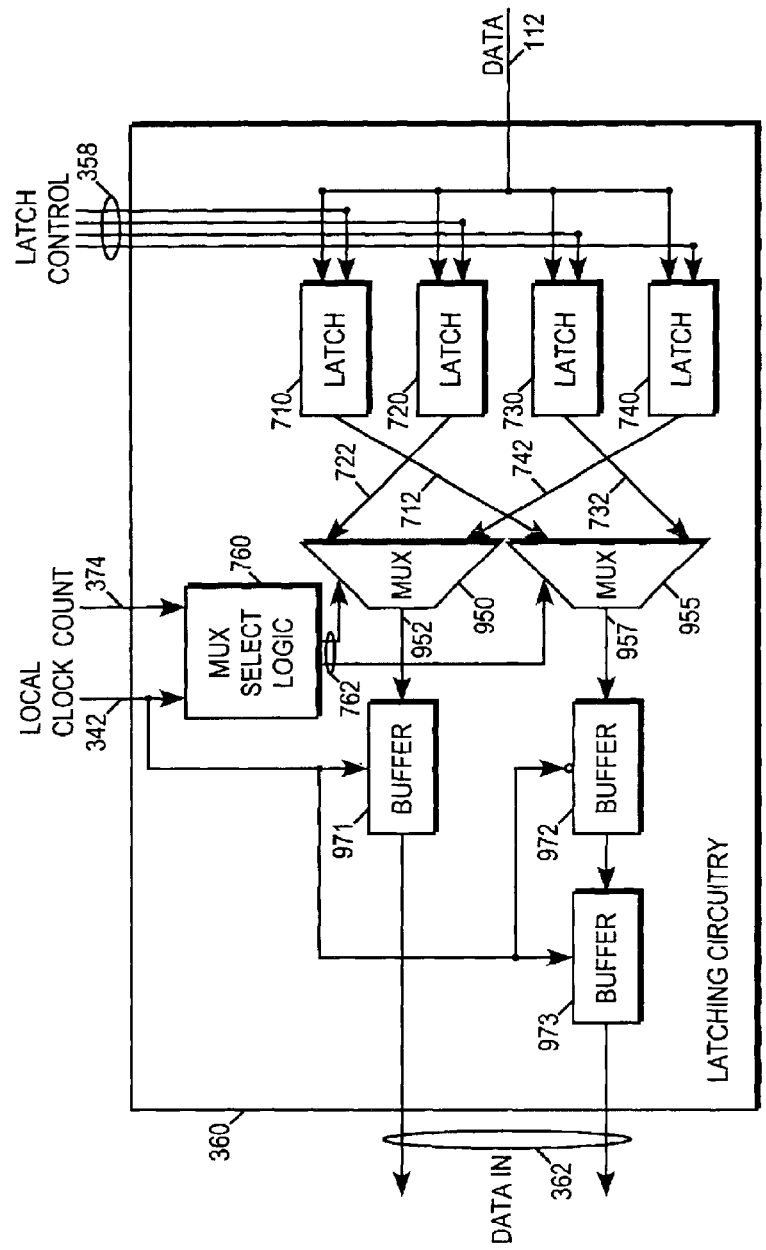
FIG. 9 illustrates, for another embodiment, latching circuitry for the receiving device of FIG. 3.

Latching circuitry 360 for another embodiment, as illustrated in FIG. 9, may comprise latches 710, 720, 730, and 740, a plurality of multiplexers (MUXs) 950 and 955, MUX select logic 760, and a plurality of buffers 971, 972, and 973.

MUX 950 is coupled to receive latch output signal(s) 722 and 742 to output one or more data signals 112 from any one latch 720 and 740, respectively, in a selective manner as one or more MUX output signals 952. MUX 955 is coupled to receive latch output signal(s) 712 and 732 to output one or more data signals 112 from any one latch 710 and 730, respectively, in a selective manner as one or more MUX output signals 957. MUXs 950 and 955 are coupled to receive one or more MUX select signals 762 generated by MUX select logic 760 to select latch output signal(s) 722 or 742 for output as MUX output signal(s) 952 and to select latch output signal(s) 712 or 732 for output as MUX output signal(s) 957.

Buffer 971 is coupled to receive MUX output signal(s) 952 and stores and outputs MUX output signal(s) 952 as one or more data in signals 362. Buffer 971 for one embodiment may be coupled to receive local clock signal 342 to help clock MUX output signal(s) 952 into and out from buffer 971 as data in signal(s) 362 aligned relative to local clock signal 342. Buffer 971 for one embodiment may store and output MUX output signal(s) 952 in response to an edge, such as a rising edge for example, of a cycle of local clock signal 342.

Buffer 972 is coupled to receive MUX output signal(s) 957 and stores and outputs MUX output signal(s) 957 to buffer 973. Buffer 973 is coupled to receive MUX output signal(s) 957 from buffer 972 and stores and outputs MUX output signal(s) 957 as one or more data in signals 362. Buffer 972 for one embodiment may be coupled to receive local clock signal 342 to help clock MUX output signal(s) 957 into and out from buffer 972. Buffer 973 for one embodiment may be coupled to receive local clock signal 342 to help clock MUX output signal(s) 957 into and out from buffer 973 as data in signal(s) 362 aligned relative to local clock signal 342. Buffer 972 for one embodiment may store and output MUX output signal(s) 957 in response to an edge, such as a falling edge for example, of a cycle of local clock signal 342. Buffer 973 for one embodiment may store and output MUX output signal(s) 957 in response to an edge, such as a rising edge for example, of a cycle of local clock signal 342.

Buffers 971, 972, and 973 may each comprise any suitable circuitry. Buffers 971, 972, and 973 for one embodiment may each comprise one or more D-type flip-flops to store one or more data signals, respectively.

Figure 10:
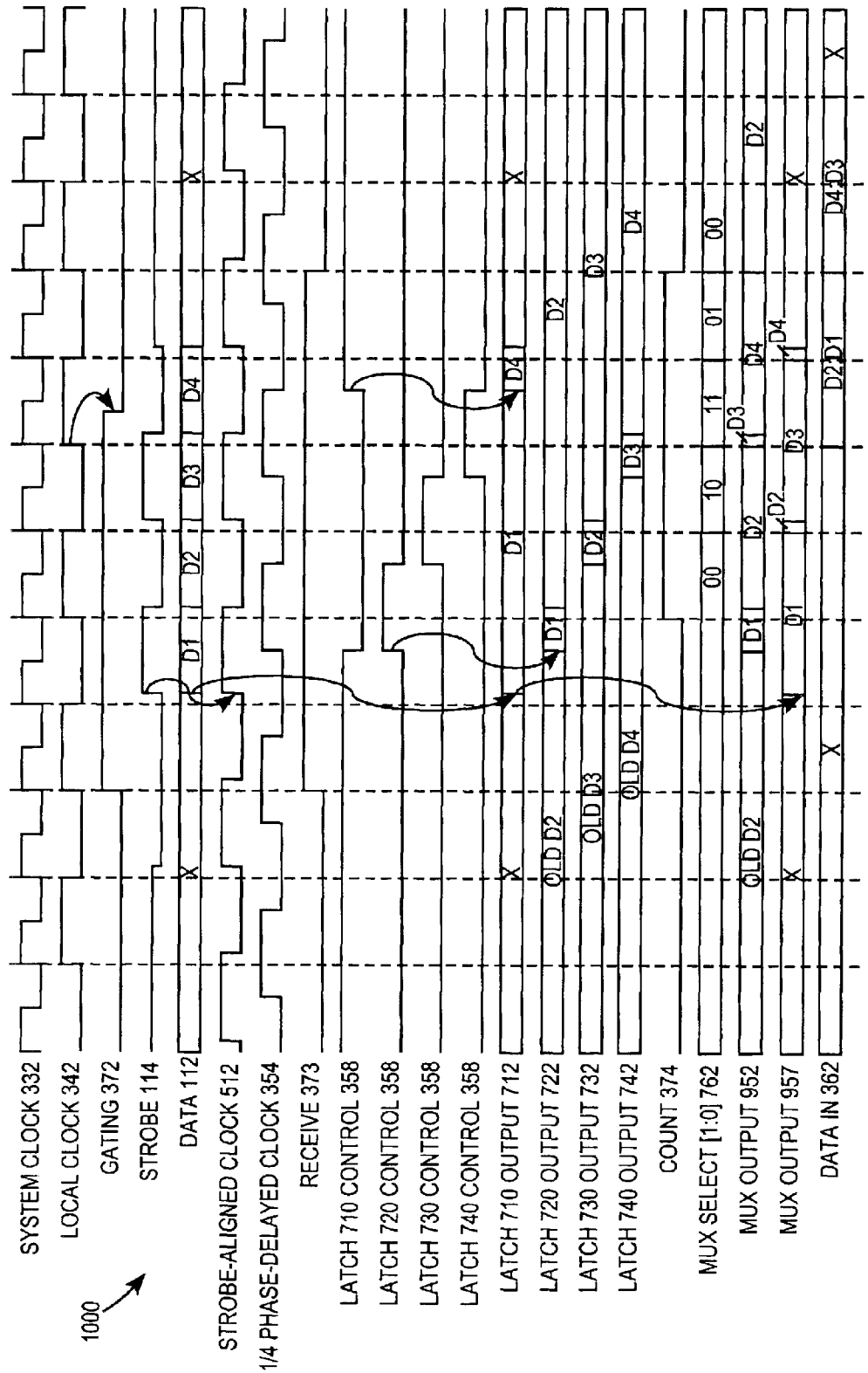
FIG. 10 illustrates, for another embodiment, a timing diagram for the receiving device of FIG. 3.

FIG. 10 illustrates, for one embodiment, an example timing diagram 1000 where receiving device 120 comprises one embodiment of latch control circuitry 350 as illustrated in FIG. 5 and one embodiment of latching circuitry 360 as illustrated in FIG. 9, where local clock source 340 generates and outputs a local clock signal 342 having approximately twice the pulse width and approximately half the frequency as system clock signal 332, and where receiving device 120 receives one or more strobe signals 114 that define a pulse having a first edge associated with a first set of one or more data signals 112 and a second edge associated with a second set of one or more data signals 112 and that are in substantial alignment with one or more data signals 112.

As illustrated in FIGS. 3, 5, 9, and 10, clock generation circuitry 352 generates clock signal 354 by generating a strobe-aligned clock signal 512 in substantial synchronization with strobe signals 114 generated by transmitting device 110 and delaying strobe-aligned clock signal 512 by approximately ¼ phase. Control signal generation circuitry 356 is responsive to a receive signal 373 to generate for each latch 710, 720, 730, and 740 a respective latch control signal 358 substantially aligned with clock signal 354 to latch a respective set D1, D2, D3, and D4 of one or more data signals 112 in each latch 710, 720, 730, and 740, respectively.

For the example of FIG. 10 where control signal generation circuitry 356 generates each latch control signal 358 as a single binary signal, each latch 710, 720, 730, and 740 outputs or passes-through the set of data signal(s) 112 at the input of latch 710, 720, 730, and 740, respectively, in response to a latch control signal 358 in a first state, such as a high state for example. Each latch 710, 720, 730, and 740 latches the set of data signal(s) at the input of latch 710, 720, 730, and 740, respectively, in response to a transition of a latch control signal 358 from the first state to a second state, such as a low state for example. Each latch 710, 720, 730, and 740 outputs the set of data signal(s) 112 latched by the latch 710, 720, 730, and 740, respectively, in response to a latch control signal 358 in the second state.

As illustrated in FIG. 10, as the set D1 of data signal(s) 112 is received by latching circuitry 360, control signal generation circuitry 356 generates a latch control signal 358 to control latch 710 to output the set D1 of data signal(s) 112 as latch output signal(s) 712 and to latch the set D1 of data signal(s) 112 while continuing to output the set D1 of data signal(s) 112 as latch output signal(s) 712. As the set D2, D3, and D4 of data signal(s) 112 are received by latching circuitry 360, control signal generation circuitry 356 similarly generates a respective latch control signal 358 to control latch 720, 730, and 740, respectively, to output the respective set D2, D3, and D4 of data signal(s) 112 as latch output signal(s) 722, 732, and 742, respectively, and to latch the respective set D2, D3, and D4 of data signal(s) 112 while continuing to output the respective set D2, D3, and D4 of data signal(s) 112 as latch output signal(s) 722, 732, and 742, respectively.

MUX select logic 760 is responsive to a count signal 374 to generate MUX select signals 762 to control MUX 950 to output the set D2 and D4 of data signal(s) 112 from latch 720 and 740, respectively, in a selective manner as MUX output signal(s) 952 and to control MUX 955 to output the set D1 and D3 of data signal(s) 112 from latch 710 and 730, respectively, in a selective manner as MUX output signal(s) 957. For the example of FIG. 10 where MUX select logic 760 generates a MUX select signal 762 as a double digit binary signal, MUX 950 outputs the set D2 and D4 of data signal(s) 112 from latch 720 and 740, respectively, in response to one digit of MUX select signal 762 being, for example, 0 and 1, respectively, and MUX 955 outputs the set D1 and D3 of data signal(s) 112 from latch 710 and 730, respectively, in response to the other digit of MUX select signal 762 being, for example, 0 and 1, respectively.

As illustrated in FIG. 10, as each set D2 and D4 of data signal(s) 112 is output as MUX output signal(s) 952, buffer 971 is responsive to an edge, such as the next rising edge for example, of local clock signal 342 to store and output each set D2 and D4 of data signal(s) 112 as data in signal(s) 362. As each set D1 and D3 of data signal(s) 112 is output as MUX output signal(s) 957, buffer 972 is responsive to an edge, such as the next falling edge for example, of local clock signal 342 to store and output each set D1 and D3 of data signal(s) 112.

Controlling both MUXs 950 and 955 to output MUX output signal(s) 952 and 957, respectively, during the same cycle of local clock signal 342 and buffering MUX output signal(s) 952 on a first edge of that same cycle of local clock signal 342 and MUX output signal(s) 957 on a second edge of that same cycle of local clock signal 342 for one embodiment may help allow data signals 112 to be transmitted from transmitting device 110 at a relatively higher speed.

As buffer 972 outputs each set D1 and D3 of data signal(s) 112, buffer 973 is responsive to an edge, such as the next rising edge for example, of local clock signal 342 to store and output each set D1 and D3 of data signal(s) 112 as data in signal(s) 362. Buffers 971 and 973 for one embodiment may therefore output as data in signals 362 both sets D1 and D2 of data signals 112 during one cycle of local clock signal 342 and both sets D3 and D4 of data signals 112 during another cycle of local clock signal 342.

Maintaining Clock Alignment

Receiving device 120 for one embodiment may help maintain the alignment of a clock signal relative to a strobe signal 114 to help minimize any deviation in the clock signal due to the passage of time without having received a strobe signal 114 from transmitting device 110. Receiving device 120 for one embodiment may help maintain the alignment of a clock signal relative to a strobe signal 114 in accordance with a flow diagram 1100 of FIG. 11.

Figure 11:
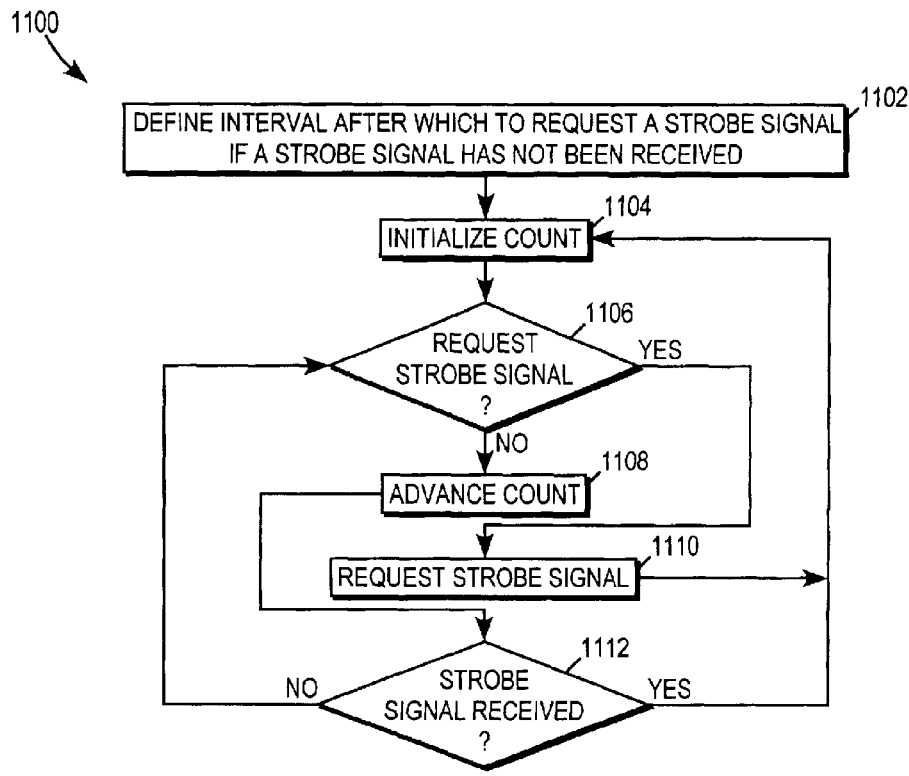
FIG. 11 illustrates, for one embodiment, a flow diagram to help maintain alignment of a clock signal relative to a strobe signal.

For block 1102 of FIG. 11, receiving device 120 defines a time interval after which receiving device 120 is to request a strobe signal 114 from transmitting device 110 if a strobe signal 114 has not been received. Receiving device 120 may define the time interval in any suitable manner. Receiver control circuitry 370 for one embodiment may define the time interval and store, for example, in a register of receiver control circuitry 370 a signal defining any suitable value to define the time interval. Receiver control circuitry 370 for one embodiment, as illustrated in FIG. 3, may output that signal as an interval signal 376 to clock alignment control circuitry 380. Receiving device 120 for one embodiment may define the time interval upon being powered or reset.

Figure 12:
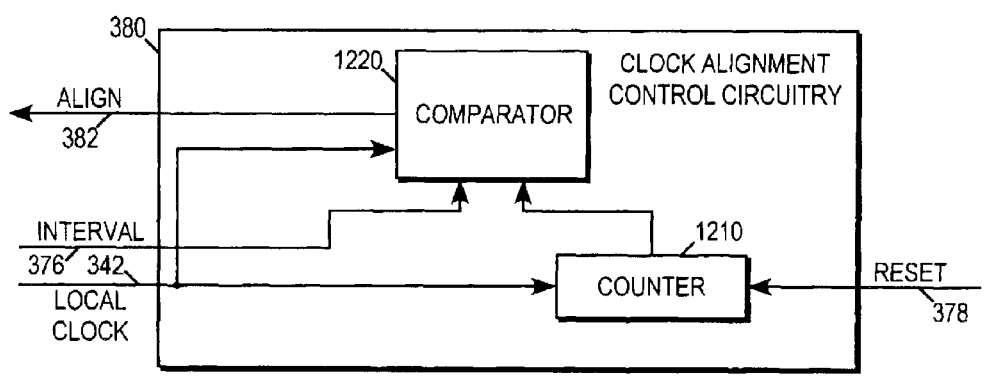
FIG. 12 illustrates, for one embodiment, clock alignment control circuitry for the receiving device of FIG. 3.

For block 1104 of FIG. 11, receiving device 120 initializes a count to help track time since receiving device 120 received a strobe signal 114. Receiving device 120 may initialize the count in any suitable manner to any suitable value, such as zero for example. For one embodiment, as illustrated in FIG. 12, clock alignment control circuitry 380 may comprise a counter 1210 coupled to receive local clock signal 342 to maintain a count and therefore help track time. Counter 1210 for one embodiment may be coupled to receive a reset signal 378 generated and output from receiver control circuitry 370 to initialize counter 1210. Receiving device 120 for one embodiment may initialize counter 1210 upon being powered or reset.

For block 1106 of FIG. 11, receiving device 120 identifies whether to request a strobe signal 114 based on the count to align the clock signal relative to a strobe signal 114. Receiving device 120 may identify whether to request a strobe signal 114 based on the count in any suitable manner. For one embodiment, as illustrated in FIG. 12, clock alignment control circuitry 380 may comprise a comparator 1220 coupled to receive interval signal 376 from receiver control circuitry 370 and coupled to receive the count from counter 1210. Comparator 1220 may compare the count with the value defined by interval signal 376 and identify that a strobe signal 114 is to be requested if the count and the value defined by interval signal 376 satisfy a predetermined relationship. Where counter 1210 is advanced in a positive direction to track time, comparator 1220 for one embodiment may compare the count with the value defined by interval signal 376 and identify that a strobe signal 114 is to be requested if the count is greater than, or greater than or equal to, the value defined by interval signal 376. Where counter 1210 is advanced in a negative direction to track time, comparator 1220 for one embodiment may compare the count with the value defined by interval signal 376 and identify that a strobe signal 114 is to be requested if the count is less than, or less than or equal to, the value defined by interval signal 376.

For another embodiment, clock alignment control circuitry 380 may comprise a register coupled to receive and store an interval signal 376 for output to comparator 1220.

If receiving device 120 identifies for block 1106 of FIG. 11 that a strobe signal 114 is not to be requested, receiving device for block 1108 advances the count. Receiving device 120 may advance the count in any suitable direction by any suitable amount in any suitable manner. For one embodiment, as illustrated in FIG. 12, counter 1210 may be advanced in response to local clock signal 342.

For block 1112 of FIG. 11, receiving device 120 identifies whether a strobe signal 114 has been received. Receiving device 120 may identify whether a strobe signal 114 has been received in any suitable manner. For one embodiment, receiver control circuitry 370 may identify that a strobe signal 114 has been received in response to transmitting a request signal 322 to transmitting device 110.

If a strobe signal 114 has not been received, receiving device 120 identifies for block 1106 whether to request a strobe signal 114 based on the advanced count to align the clock signal relative to a strobe signal 114. If a strobe signal 114 has been received, allowing receiving device 120 to align the clock signal to the received strobe signal 114, receiving device 120 may then reinitialize the count for block 1104. Receiving device 120 may reinitialize the count for block 1104 in any suitable manner. For one embodiment, as illustrated in FIGS. 1 and 12, receiver control circuitry 370 may reinitialize counter 1210 by generating and outputting a reset signal 378 to clock alignment control circuitry 380 to reinitialize counter 1210.

If receiving device 120 identifies for block 1106 of FIG. 11 that a strobe signal is to be requested, receiving device 120 for block 1110 requests a strobe signal 114 from transmitting device 110 to align the clock signal relative to a strobe signal 114. Receiving device 120 may request a strobe signal 114 in any suitable manner. For one embodiment, as illustrated in FIG. 12, comparator 1220 transmits an align signal 382 to receiver control circuitry 370 if the count and the value defined by interval signal 376 satisfy a predetermined relationship. Receiver control circuitry 370 for one embodiment may then transmit a request signal 322 defining a read request for one or more data signals 112 from transmitting device 110 to receive a strobe signal 114. Receiver control circuitry 370 for one embodiment may transmit a request signal 322 defining a dummy read request that requests one or more data signals 112 that are to be ignored by receiving device 120. Receiver control circuitry 370 for another embodiment may prioritize a pending read request and transmit a request signal 322 defining that read request. When receiving device 120 receives a strobe signal 114, receiving device 120 may then align the clock signal to the received strobe signal 114. After requesting a strobe signal 114 for block 1110, receiving device 120 may then reinitialize the count for block 1104.

Receiving device 120 may repeat operations for blocks 1104–1112 to help ensure that the clock signal is aligned relative to a strobe signal 114 at least as often as approximately the defined time interval since the just prior alignment.

Receiving device 120 may perform operations for blocks 1102–1112 in any suitable order and may or may not overlap in time the performance of any suitable operation with any other suitable operation. Receiving device 120 for another embodiment may, for example, perform operations for block 1112 prior to or while performing operations for blocks 1106 and 1108.

Although described as being separate from receiver control circuitry 370, clock alignment control circuitry 380 for another embodiment may form a part of receiver control circuitry 370.

Memory Control

Transmitting device 110 for one embodiment may comprise other suitable circuitry to perform one or more other suitable functions. Receiving device 120 for one embodiment may comprise other suitable circuitry to perform one or more other suitable functions. Transmitting device 110 for one embodiment may generally correspond to a memory module, and receiving device 120 for one embodiment may generally correspond to a memory controller.

Figure 13:
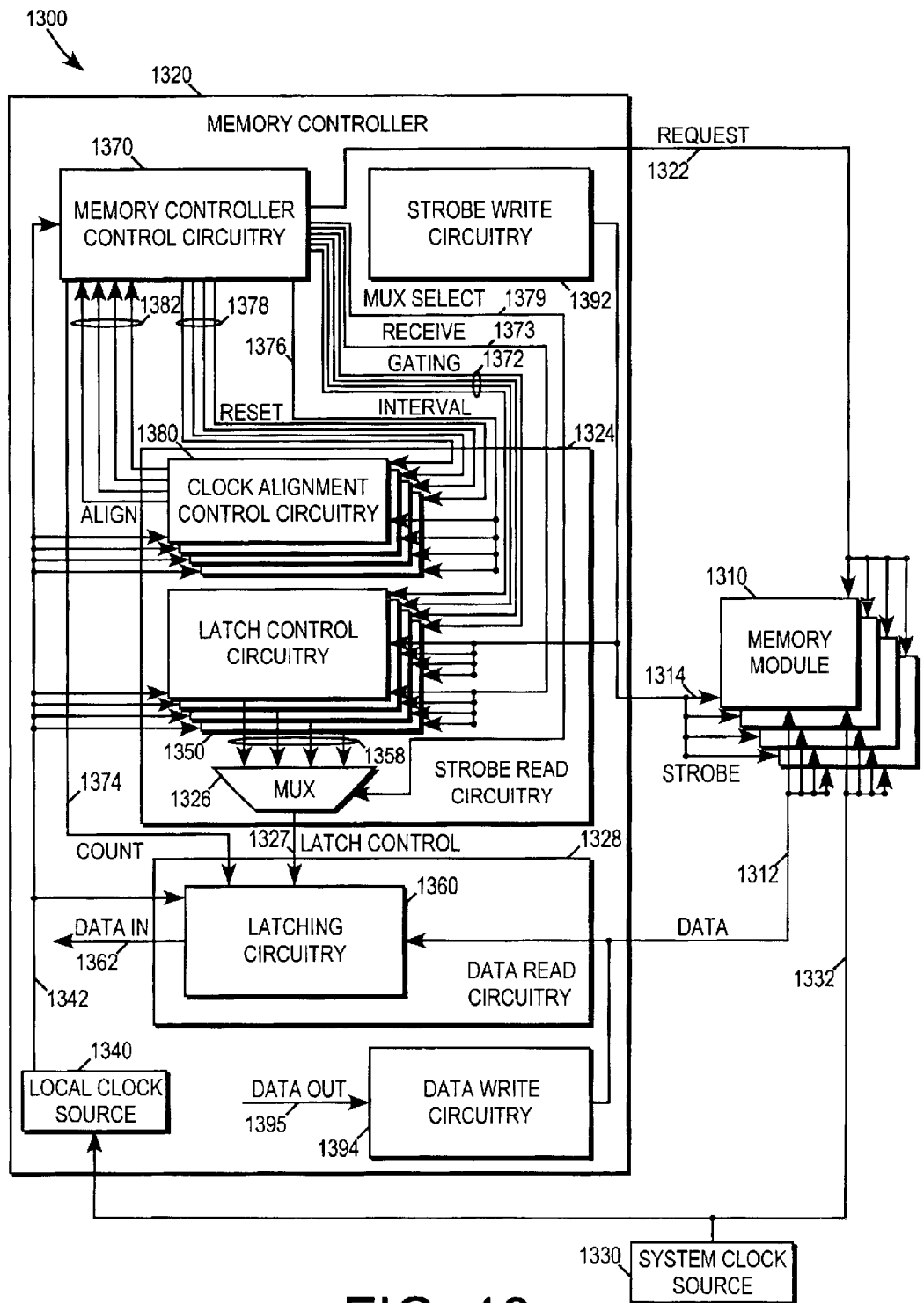
FIG. 13 illustrates, for one embodiment, a memory controller having data signal reception latch control using a clock aligned relative to a strobe signal.

FIG. 13 illustrates, for one embodiment, a memory system 1300 comprising a set of memory modules 1310 coupled to a memory controller 1320 having data signal reception latch control using a clock aligned relative to a strobe signal. The set of memory modules 1310 may comprise any suitable memory circuitry. For one embodiment, the set of memory modules 1310 comprises circuitry for double data rate (DDR) dynamic random access memory (DRAM). Although illustrated as having four memory modules 1310, memory system 1300 for another embodiment may comprise one, two, three, or more than four memory modules 1310. Each memory module 1310 generally corresponds to transmitting device 110 of FIGS. 1 and 3, and memory controller 1320 generally corresponds to receiving device 120 of FIGS. 1 and 3.

A memory module 1310 may receive and store data and/or instructions, for example, in response to one or more memory write requests from memory controller 1320 and may transmit stored data and/or instructions, for example, in response to one or more memory read requests from memory controller 1320. Memory controller 1320 for one embodiment may transmit to the set of memory modules 1310 a request signal 1322 that defines a memory write or read request. For a memory write request, memory controller 1320 may transmit to one or more memory modules 1310 one or more data signals 1312 that define the data and/or instructions to be stored by one or more memory modules 1310 and one or more strobe signals 1314 in association with one or more sets of one or more data signals 1312 to help one or more memory modules 1310 identify one or more data signals 1312. For a memory read request, one or more memory modules 1310 may transmit to memory controller 1320 one or more data signals 1312 that define the data and/or instructions requested by memory controller 1320 and one or more strobe signals 1314 in association with one or more sets of one or more data signals 1312 to help memory controller 1320 identify one or more data signals 1312. Data signal(s) 1312, strobe signal(s) 1314, and request signal 1322 generally correspond to data signal(s) 112, strobe signal(s) 114, and request signal 322, respectively, of FIGS. 1 and 3.

Memory system 1300 for one embodiment may comprise a system clock source 1330 to generate and output a system clock signal 1332 to the set of memory modules 1310 and to memory controller 1320. System clock source 1330 and system clock signal 1332 generally correspond to system clock source 330 and system clock signal 332, respectively, of FIG. 3.

Memory controller 1320 for one embodiment, as illustrated in FIG. 13, may comprise strobe read circuitry 1324, data read circuitry 1328, local clock source 1340, memory controller control circuitry 1370, strobe write circuitry 1392, and data write circuitry 1394.

Local clock source 1340 for one embodiment may be coupled to receive system clock signal 1332 to generate and output a local clock signal 1342. Local clock source 1340 and local clock signal 1342 generally correspond to local clock source 340 and local clock signal 342, respectively, of FIG. 3.

Memory controller control circuitry 1370 generally corresponds to receiver control circuitry 370 of FIG. 3.

Strobe read circuitry 1324 for one embodiment may receive one or more strobe signals 1314 transmitted by a memory module 1310 in association with one or more data signals 1312 for a memory read request. Strobe read circuitry 1324 may then generate and output one or more latch control signals 1327 aligned relative to a clock signal aligned relative to a strobe signal 1314 from a memory module 1310 to latch one or more data signals 1312. Strobe read circuitry 1324 for one embodiment may comprise a set of latch control circuitries 1350, a multiplexer (MUX) 1326, and a set of clock alignment control circuitries 1380.

Each latch control circuitry 1350 for one embodiment may generate a clock signal aligned relative to a strobe signal 1314 received from a memory module 1310 and generate and output one or more latch control signals 1358 aligned relative to the generated clock signal. Each latch control circuitry 1350 for one embodiment may be coupled to receive one or more strobe signals 1314 from a memory module 1310, one or more gating signals 1372 from memory controller control circuitry 1370, one or more receive signals 1373 from memory controller control circuitry 1370, and local clock signal 1342. Although illustrated in FIG. 13 as receiving a receive signal 1373 transmitted over a common signal line from memory controller control circuitry 1370, each latch control circuitry 1350 for another embodiment may receive a receive signal 1373 transmitted over a respective receive signal line from memory controller control circuitry 1370. Each latch control circuitry 1350, latch control signal(s) 1358, gating signal(s) 1372, and receive signal(s) 1373 generally correspond to latch control circuitry 350, latch control signal(s) 358, gating signal(s) 372, and receive signal(s) 373, respectively, of FIG. 3.

Each latch control circuitry 1350 for one embodiment may be associated with a respective memory module 1310 and generate a clock signal aligned relative to a strobe signal 1314 from its associated memory module 1310 to generate one or more latch control signals 1358 to latch one or more data signals 1312 from its associated memory module 1310. In this manner, each latch control circuitry 1350 better accounts for timing variations due to, for example, process, voltage, and temperature (PVT) variations that are associated with its associated memory module 1310.

Each latch control circuitry 1350 for one embodiment may be associated with a respective strobe signal line and generate a clock signal aligned relative to a strobe signal 1314 transmitted over its associated strobe signal line to generate one or more latch control signals 1358 to latch one or more data signals 1312 associated with a strobe signal 1314 transmitted over its associated strobe signal line. In this manner, each latch control circuitry 1350 better accounts for timing variations due to, for example, process, voltage, and temperature (PVT) variations that are associated with the circuitry that generates and outputs a strobe signal 1314 and its associated data signal(s) 1312. Where a memory module 1310 may have a plurality of separate strobe signal lines, such as 8 for example, with each strobe signal line associated with a respective set of one or more data signal lines, strobe read circuitry 1324 for one embodiment may comprise a separate latch control circuitry 1350 for each of the strobe signal lines for that memory module 1310.

Each latch control circuitry 1350 for one embodiment, as illustrated in FIG. 13, may receive a strobe signal 1314 transmitted over a common signal line from the set of memory modules 1310. Memory controller control circuitry 1370 for one embodiment may generate one or more gating signals 1372 to allow a latch control circuitry 1350 to receive a strobe signal 1314 from the common signal line while preventing other latch control circuitry 1350 from receiving that same strobe signal 1314. In this manner, memory controller control circuitry 1370 may help each latch control circuitry 1350 maintain alignment of its clock signal with strobe signals from an associated memory module 1310 and/or an associated strobe signal line. Each latch control circuitry 1350 for another embodiment may receive a strobe signal 1314 transmitted over a respective strobe signal line from the set of memory modules 1310.

MUX 1326 is coupled to receive latch control signal(s) 1358 from each latch control circuitry 1350 and to output latch control signal(s) 1358 from one latch control circuitry 1350 in a selective manner to data read circuitry 1328 as one or more latch control signals 1327. MUX 1326 for one embodiment may be coupled to receive one or more MUX select signals 1379 generated by memory controller control circuitry 1370 to help select latch control signal(s) 1358 for output as latch control signal(s) 1327. Memory controller control circuitry 1370 for one embodiment may generate one or more MUX select signals 1379 in response to transmitting a request signal 1322 to memory modules 1310. Memory controller control circuitry 1370 for one embodiment may generate one or more MUX select signals 1379 at a suitable delay following transmission of a request signal 1322.

Each clock alignment control circuitry 1380 for one embodiment may help maintain for a latch control circuitry 1350 the alignment of a clock signal relative to a strobe signal 1314 and generate and output one or more align signals 1382 to memory controller control circuitry 1370. For one embodiment, each clock alignment control circuitry 1380 may generate one or more align signals 1382 for a respective latch control circuitry 1350. Each clock alignment control circuitry 1380 for one embodiment may be coupled to receive an interval signal 1376 from memory controller control circuitry 1370, a respective reset signal 1378 from memory controller control circuitry 1370, and local clock signal 1342. Each clock alignment control circuitry 1380, interval signal 1376, each reset signal 1378, and each align signal 1382 generally correspond to clock alignment control circuitry 380, interval signal 376, reset signal 378, and align signal 382, respectively, of FIG. 3.

Although illustrated in FIG. 13 as receiving an interval signal 1376 transmitted over a common signal line from memory controller control circuitry 1370, each clock alignment control circuitry 1380 for another embodiment may receive an interval signal 1376 transmitted over a respective interval signal line from memory controller control circuitry 1370. In this manner, memory controller control circuitry 1370 for one embodiment may define separate time intervals for each clock alignment control circuitry 1380.

Data read circuitry 1328 for one embodiment may receive one or more data signals 1312 transmitted by a memory module 1310 for a memory read request. Data read circuitry 1328 may latch one or more data signals 1312 using one or more latch control signals 1327. Data read circuitry 1328 for one embodiment may comprise latching circuitry 1360.

Latching circuitry 1360 for one embodiment may latch one or more data signals 1312 received from a memory module 1310 using one or more latch control signals 1327 and output one or more data signals 1312 as one or more data in signals 1362. Latching circuitry 1360 for one embodiment may be coupled to receive one or more data signals 1312 from one or more memory modules 1310, one or more latch control signals 1327 from MUX 1326, one or more count signals 1374 from memory controller control circuitry 1370, and local clock signal 1342. Latching circuitry 1360, data in signal(s) 1362, and count signal(s) 1374 generally correspond to latching circuitry 360, data in signal(s) 362, and count signal(s) 374, respectively, of FIG. 3.

Strobe write circuitry 1392 for one embodiment may generate and transmit one or more strobe signals 1314 to a memory module 1310 in association with one or more data signals 1312 for a memory write request. Strobe write circuitry 1392 may comprise any suitable circuitry to generate and transmit one or more strobe signals 1314 in any suitable manner.

Data write circuitry 1394 for one embodiment may transmit one or more data signals 1312 to a memory module 1310 for a memory write request. Data write circuitry 1394 for one embodiment is coupled to receive one or more data out signals 1395 from any suitable source for transmission as one or more data signals 1312. Data write circuitry 1394 may comprise any suitable circuitry to transmit one or more data signals 1312 in any suitable manner.

Figure 14:
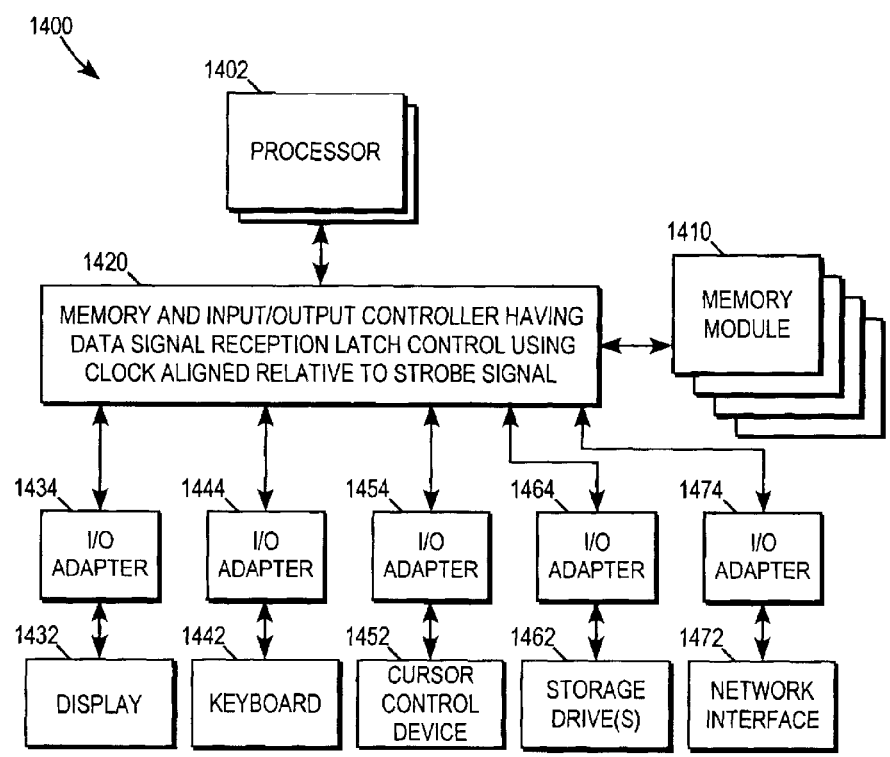
FIG. 14 illustrates, for one embodiment, a computer system comprising a memory and input/output (I/O) controller having data signal reception latch control using a clock aligned relative to a strobe signal.

Memory system 1300 of FIG. 13 may be used in any suitable system. For one embodiment, memory system 1300 may be used in a computer system 1400 as illustrated in FIG. 14.

Computer system 1400 comprises processors 1402, a set of memory modules 1410, and a memory and input/output (I/O) controller 1420 having data signal reception latch control using a clock aligned relative to a strobe signal. A processor 1402 for one embodiment may transmit one or more memory read requests and/or one or more memory write requests to memory and I/O controller 1420 to read data and/or instructions from the set of memory modules 1410 and/or to write data and/or instructions to the set of memory modules 1410, respectively. Although illustrated as having two processors 1402, computer system 1400 for another embodiment may comprise one processor 1402 or more than two processors 1402. Each memory module 1410 generally corresponds to a memory module 1310 of FIG. 13, and at least a portion of a memory controller of memory and I/O controller 1420 generally corresponds to memory controller 1320 of FIG. 13.

Computer system 1400 for one embodiment may also comprise a display 1432 coupled to memory and I/O controller 1420 by a suitable I/O adapter 1434; a keyboard 1442 coupled to memory and I/O controller 1420 by a suitable I/O adapter 1444; a cursor control device 1452, such as a mouse or touch tablet for example, coupled to memory and I/O controller 1420 by a suitable I/O adapter 1454; one or more storage drives 1462 coupled to memory and I/O controller 1420 by a suitable I/O adapter 1464; and/or a network interface 1472 coupled to memory and I/O controller 1420 by a suitable I/O adapter 1474.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
    requesting a strobe signal from a transmitting device, if no strobe signal has been received within a pre-determined time period;
    generating a clock signal aligned relative to an edge of the strobe signal; and
    latching one or more data signals received from the transmitting device using the clock signal.

2. The method of claim 1, wherein the clock signal is not edge aligned with the strobe signal.

3. The method of claim 1, wherein the method comprises generating one or more latch control signals aligned relative to the clock signal; and
    wherein the latching comprises latching one or more data signals received from the transmitting device with the one or more latch control signals.

4. The method of claim 3, wherein the generating the clock signal comprises substantially aligning an edge of the clock signal with an edge of the strobe signal; and
    wherein the generating one or more latch control signals comprises substantially aligning an edge of one or more latch control signals relative to an edge of the clock signal, wherein the latch control signals and the clock signal are not edge aligned.

5. The method of claim 3, wherein the latching comprises latching a first set of a plurality of data signals with a first latch control signal and latching a second set of a plurality of data signals with a second latch control signal.

6. The method of claim 1, wherein the strobe signal a pulse having a first edge associated with a first set of one or more data signals and a second edge associated with a second set of one or more data signals.

7. The method of claim 3, wherein the latch control signals are phase delayed from the strobe signal.

8. An apparatus comprising:
   clock generation circuitry to generate a clock signal aligned relative to an edge of a strobe signal received from a transmitting device, wherein the apparatus requests the strobe signal from the transmitting device if no strobe signal has been received within a pre-determined time period;
   control signal generation circuitry to generate one or more latch control signals aligned relative to an edge of the clock signal; and
   latching circuitry to latch one or more data signals received from the transmitting device with one or more latch control signals.

9. The apparatus of claim 8, wherein the clock signal is not edge-aligned with the strobe signal.

10. The apparatus of claim 8, wherein the clock signal is substantially edge aligned with the strobe signal; and
   wherein the control signal generation circuitry generates one or more latch control signals that are not edge-aligned with the clock signal.

11. The apparatus of claim 8, wherein the strobe signal is a pulse having a first edge associated with a first set of one or more data signals and a second edge associated with a second set of one or more data signals.

12. The apparatus of claim 8, wherein the latching circuitry comprises a first latch to latch a first set of a plurality of data signals with a first latch control signal and a second latch to latch a second set of a plurality of data signals with a second latch control signal.

13. The apparatus of claim 8, comprising clock alignment control circuitry to request the strobe signal.

14. The apparatus of claim 13, wherein the clock alignment control circuitry comprises a counter to maintain a count to track time and a comparator to compare the count to a predetermined time interval.

15. An apparatus comprising:
   means for aligning a clock signal relative to a strobe signal, wherein the apparatus requests the strobe signal from a transmitting device if no strobe signal has been received within a pre-determined time period; and
   means for latching one or more data signals using the clock signal.

16. The apparatus of claim 15, wherein the clock signal and the strobe signal are not edge-aligned.

17. The apparatus of claim 15, comprising means for generating one or more latch control signals aligned relative to with the clock signal.

18. The apparatus of claim 17, wherein the latch control signals are not edge aligned with the strobe signal.

19. The apparatus of claim 15, comprising means for requesting the strobe signal.

20. A system comprising:
   one or more processors;
   one or more memory modules; and
   a memory controller coupled to one or more processors and to one or more memory modules, the memory controller having data signal reception latch control using a clock aligned relative to a strobe signal received from a memory module, wherein the memory controller requests the strobe signal if no strobe signal has been received within a pre-determined time period.

21. The system of claim 20, wherein the memory controller comprises respective latch control circuitry for each of a plurality of strobe signal lines for the one or more memory modules, each latch control circuitry comprising clock generation circuitry to generate a clock signal aligned relative to an edge of a strobe signal received from the respective strobe signal line and control signal generation circuitry to generate one or more latch control signals aligned relative to an edge of the clock signal.

22. The system of claim 21, wherein the clock signal and the strobe signal are not edge-aligned.

23. The system of claim 21, wherein the clock signal and the strobe signal are substantially edge-aligned, wherein the one or more latch control signals are not edge-aligned with the clock signal.

24. The system of claim 21, wherein the memory controller comprises latching circuitry to latch one or more data signals received from one or more memory modules with the one or more latch control signals.

25. The system of claim 20, wherein the memory controller comprises respective clock alignment control circuitry for each of a plurality of strobe signal lines for one or more memory modules, wherein each clock alignment control circuitry requests to receive an associated strobe signal over the respective strobe signal line for alignment of an associated lock signal, if no associated strobe signal has been received within a pre-determined time period.

26. The system of claim 20, wherein one or more memory modules comprise double data rate dynamic random access memory (DDR DRAM).

* * * * *

UNITED STATES PATENT AND TRADEMARK OFFICE
CERTIFICATE OF CORRECTION

PATENT NO. : 6,930,932 B2  
APPLICATION NO. : 10/650071  
DATED : August 16, 2005  
INVENTOR(S) : Eric McCutcheon Rentschler Page 1 of 1

It is certified that error appears in the above-identified patent and that said Letters Patent is hereby corrected as shown below:

On the face page, in field (57), under "Abstract", in column 2, line 3, after "edge of" delete "a".

In column 19, line 3, in Claim 6, after "signal" insert -- is --.

In column 20, line 5, in Claim 17, after "to" delete "with".

In column 20, line 45, in Claim 25, delete "lock" and insert -- clock --, therefor.

Signed and Sealed this

Eleventh Day of August, 2009

David J. Kappos  
*Director of the United States Patent and Trademark Office*